(12) United States Patent
Lu

(10) Patent No.: US 12,342,525 B2
(45) Date of Patent: Jun. 24, 2025

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 467 days.

(21) Appl. No.: 17/747,314

(22) Filed: May 18, 2022

(65) Prior Publication Data

US 2023/0111385 A1 Apr. 13, 2023

(30) Foreign Application Priority Data

Oct. 13, 2021 (CN) .......................... 202111194322.0

(51) Int. Cl.
*H10B 12/00* (2023.01)
(52) U.S. Cl.
CPC ........... *H10B 12/053* (2023.02); *H10B 12/34* (2023.02)
(58) Field of Classification Search
None
See application file for complete search history.

(56) References Cited

U.S. PATENT DOCUMENTS 10,615,164 B2 * 4/2020 Kim .................... H10D 62/115
2024/0021518 A1 * 1/2024 Lu ........................ H10B 12/488

FOREIGN PATENT DOCUMENTS

CN 111785718 A 10/2020
CN 113594097 A 11/2021

* cited by examiner

*Primary Examiner* — Sarah K Salerno
(74) *Attorney, Agent, or Firm* — Kilpatrick Townsend & Stockton LLP

(57) ABSTRACT

A method for manufacturing a semiconductor structure includes: providing a substrate and multiple spaced active areas on the substrate and an isolation structure between the adjacent active areas, in which, each of active areas includes multiple sub-active areas which intersect the initial bit line, and an initial bit line is provided on the substrate; patterning the active areas, the isolation structure and the initial bit line to form a word line trench located within the sub-active areas, the isolation structure, and the initial bit line, in which the remaining initial bit line serves as a bit line; forming a gate dielectric layer located on surfaces of the sub-active areas exposed by the word line trench; forming a word line and an insulating structure between the word line and the bit line, in which the word line is located on the gate dielectric layer and fills the word line trench.

17 Claims, 15 Drawing Sheets

Y1

Y2

X1

X2

METHOD FOR MANUFACTURING SEMICONDUCTOR STRUCTURE AND SEMICONDUCTOR STRUCTURE

CROSS-REFERENCE TO RELATED APPLICATION

The present application claims priority to Chinese Patent Application No. 202111194322.0, filed on Oct. 13, 2021, the disclosure of which is hereby incorporated by reference in its entirety.

BACKGROUND

Memory is a memory component used to store programs and various data information. Random access memory (RAM) used in general computer systems may be divided into dynamic random access memory (DRAM) and static random-access memory (SRAM). Dynamic random access memory is commonly used semiconductor memory devices in computers, and consists of many repetitive storage units.

A storage unit typically includes a capacitor and a transistor, the drain of the transistor is connected with a bit line, and the source of the transistor is connected with a capacitor device. The capacitor device includes a capacitor contact structure and a capacitor, and the word line of the storage unit is able to control the turn-on or turn-off of the channel region of the transistor, thereby reading the data information stored in the capacitor through the bit line or writing the data information into the capacitor through the bit line for storage.

However, at present, the manufacturing process of memory is complicated.

SUMMARY

Embodiments of the disclosure relate to the field of semiconductor, in particular to a method for manufacturing a semiconductor structure and a semiconductor structure.

Embodiments of the disclosure provide a method for manufacturing a semiconductor structure and a semiconductor structure, at least in favor of optimizing the process of the method for manufacturing a semiconductor structure.

According to some embodiments of the disclosure, in one aspect, the embodiments of the present disclosure provide a method for manufacturing a semiconductor structure The method includes: providing a substrate and a plurality of spaced active areas on the substrate and an isolation structure located between adjacent ones of the active areas, in which the active areas extend along a first direction parallel to a surface of the substrate, each active area includes a plurality of sub-active areas arranged along the first direction, an initial bit line extending along a second direction parallel to the surface of the substrate is provided on the substrate, and the sub-active areas intersect the initial bit line; forming a word line trench extending along a third direction parallel to the surface of the substrate by patterning the active areas, the isolation structure and the initial bit line, in which the word line trench is located within the sub-active areas, the isolation structure and the initial bit line, and the remaining initial bit line serves as a bit line; forming a gate dielectric layer located on surfaces of the sub-active areas exposed by the word line trench; forming a word line and an insulating structure, in which the word line is located on the gate dielectric layer and fills the word line trench, and the insulating structure is located between the word line and the bit line.

According to some embodiments of the disclosure, in another aspect, the embodiments of the present disclosure provide a semiconductor structure, the semiconductor structure includes: a substrate and a plurality of spaced active areas on the substrate and an isolation structure between adjacent ones of the active areas, in which the active areas extend along a first direction parallel to a surface of the substrate, and each active area includes a plurality of sub-active areas arranged along the first direction, an bit line extending along a second direction parallel to the surface of the substrate is provided on the substrate, and the sub-active areas intersect the bit line; a word line trench extending along a third direction parallel to the surface of the substrate, in which the word line trench is located within the sub-active areas, the isolation structure, and the bit line; a gate dielectric layer located on surfaces of the sub-active areas exposed by the word line trench; a word line and an insulating structure, in which the word line is located on the gate dielectric layer and fills the word line trench, and the insulating structure being is located between the word line and the bit line.

BRIEF DESCRIPTION OF THE DRAWINGS

One or more embodiments are exemplary illustrated by the figures in the corresponding drawings, which does not constitute a limitation on embodiments, and the figures in the drawings do not constitute a scale limiting unless otherwise stated.

FIGS. 11X1, 12X1, and 13X1 are cross-sectional views taken along line X1 of FIG. 10 illustrating a semiconductor device according to some embodiments of the present disclosure.

FIGS. 11X2, 12X2, and 13X2 are cross-sectional views taken along line X2 of FIG. 10 illustrating a semiconductor device according to some embodiments of the present disclosure.

FIGS. 11Y1, 12Y2, and 13Y1 are cross-sectional views taken along line Y1 of FIG. 10 illustrating a semiconductor device according to some embodiments of the present disclosure.

FIGS. 11Y2, 12Y2, and 13Y2 are cross-sectional views taken along line Y2 of FIG. 10 illustrating a semiconductor device according to some embodiments of the present disclosure.

DETAILED DESCRIPTION

Figure 1:
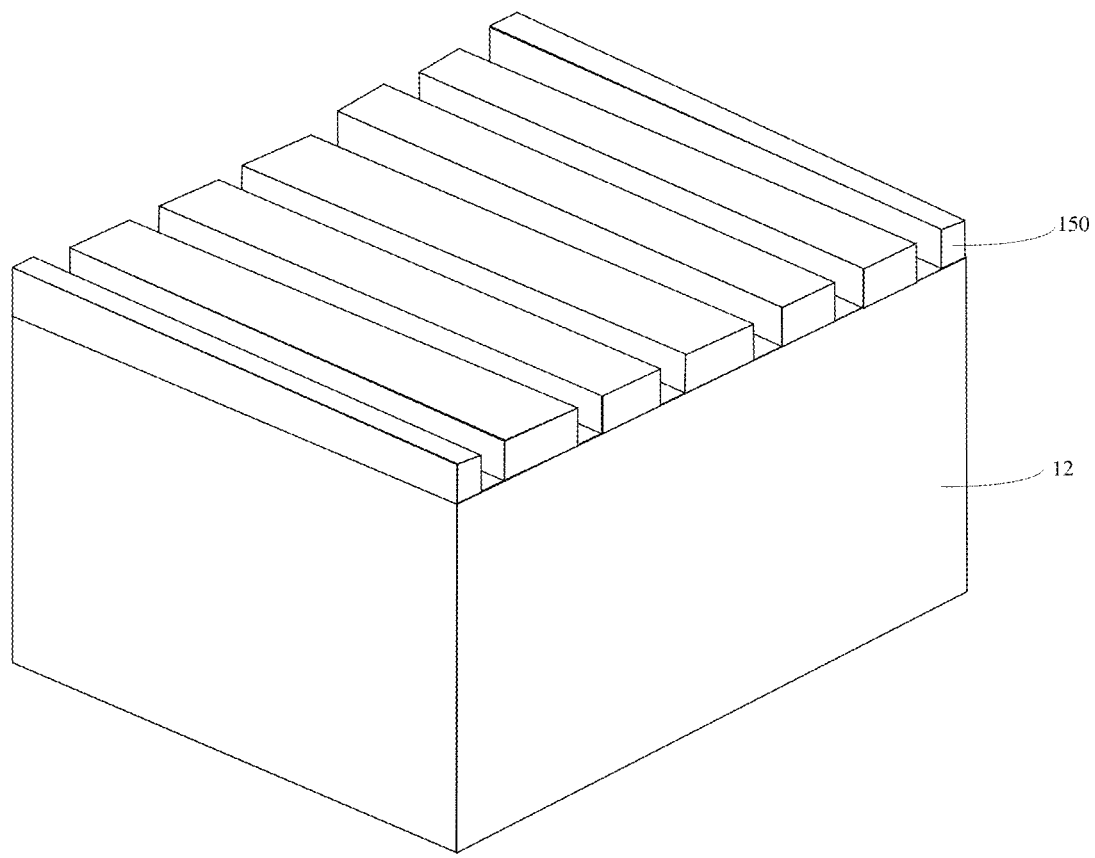
FIGS. 1-4, 7-10, and 14-15 illustrate schematic semiconductor structural diagrams corresponding to each operation in a method for manufacturing a semiconductor structure provided by the embodiment of the present disclosure.

Embodiments of the disclosure provide a method for manufacturing a semiconductor structure and the semiconductor structure, in which the process of the method for manufacturing a semiconductor structure is optimized by forming bit line first and then word line.

The embodiments of the present disclosure will be described in detail below with reference to the accompanying drawings. Those ordinary skilled in the art should understand that in each embodiment of the present disclosure, numerous technical details are proposed for a reader to better understand the present disclosure. However, even without these technical details and various variations and modifications based on the following embodiments, the technical solutions claimed in the present disclosure can be realized.

As used herein, the singular forms "a", "an", and "the" are intended to include the plural forms as well, unless the context clearly indicates otherwise.

Referring to FIGS. 1-9, a substrate 100 and a plurality of spaced active areas 110 located on the substrate 100 and an isolation structure 120 located between adjacent ones of the active areas 110 are provided, in which the active areas 110 extend along a first direction X parallel to a surface of the substrate 100, and each active area 110 includes a plurality of sub-active areas 11 arranged along the first direction X, an initial bit line 130 extending along a second direction Y parallel to the surface of the substrate 100 is provided on the substrate 100, and the sub-active areas 11 intersect the initial bit line 130 respectively.

Figure 2:
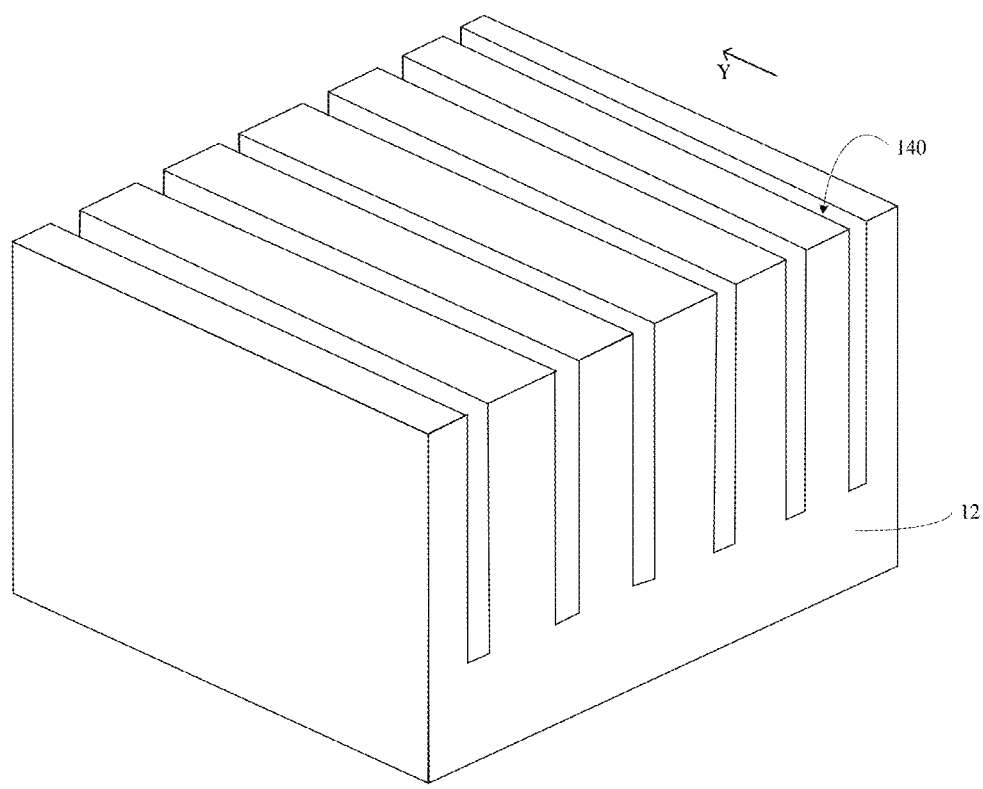

Specifically, referring to FIGS. 1 and 2, an initial substrate 12 is provided; and the initial substrate 12 is patterned to form a bit line trench 140 extending in the second direction Y. In some embodiments, the initial substrate 12 may be patterned by a mask etching method, in which a mask layer 150 with a pattern is formed on the surface of the initial substrate 12 and the initial substrate 12 is etched using the mask layer 150 as a mask to form the bit line trenches 140.

In some embodiments, the material of the initial substrate 12 may be a compound material such as silicon material, germanium material or gallium arsenide. In other embodiments, the initial substrate 12 may also be an insulating material, it should be understood that the corresponding materials may be selected according to the requirements.

Figure 3:
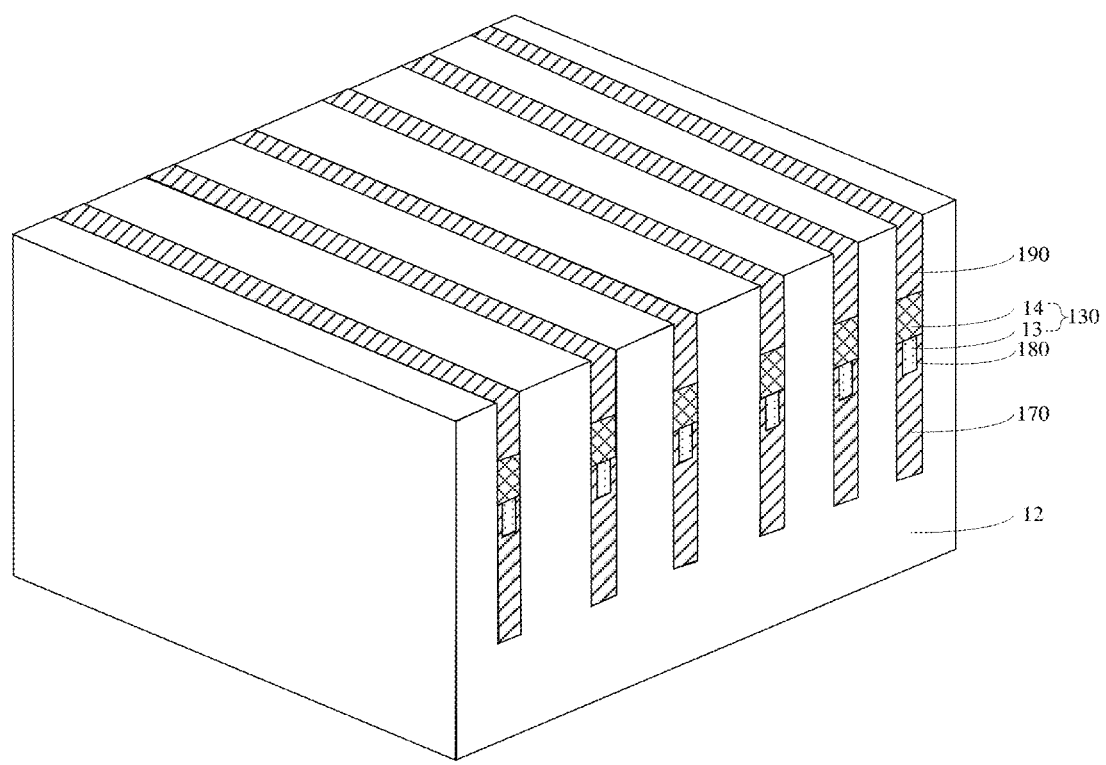

Referring to FIG. 3, an initial bit line 130 that fills the bit line trench 140 (refer to FIG. 2) is formed. In some embodiments, the initial bit line 130 includes an initial bit line metal layer 13 and an initial bit line contact layer 14 stacked in sequence. In other embodiments, the initial bit line may also be a single-layer structure including only the initial bit line metal layer or the initial bit line contact layer.

In some embodiments the material of the initial bit line metal layer 13 may be tungsten metal and the material of the initial bit line contact layer 14 may be polysilicon.

Before the initial bit line 130 is formed, the method further includes: forming a first isolation layer 170 in the bit line trench 140 (refer to FIG. 2), and the first isolation layer 170 is located between the initial bit line 130 and the substrate 100 and is used for isolating the initial bit line metal layer 13 from directly contacting the substrate 100 to prevent ion diffusion of the initial bit line metal layer 13 from contaminating the substrate 100.

In some embodiments, the material of the first isolation layer 170 may be silicon nitride.

In some embodiments, the method for forming the first isolation layer 170 includes: forming an initial isolation layer within the bit line trench 140 (refer to FIG. 2), in which the top surface of the initial isolation layer is lower than the top surface of the initial substrate 12; patterning a partial thickness of the initial isolation layer to form a groove, in which the initial isolation layer directly below the groove serves as the first isolation layer 170, and the initial isolation layer between the inner walls of the grooves and the initial substrate 12 serves as a first protective layer 180, which provides a technological basis for the subsequent formation of the first air gap.

In some embodiments, a method for forming the initial bit line 130 include: forming the initial bit line 130 that fills up a groove, in which the top surface of the initial bit line 130 is higher than the top surface of the first protective layer 180, and a partial thickness of the initial bit line 130 is in contact with the sidewall of the initial substrate 12, in which the sidewall of the initial bit line metal layer 13 of the initial bit line 130 are in contact with the sidewall of the first protective layer 180. Understandably, ion diffusion may occur in the metal material of the initial bit line metal layer 13, which may lead to the contamination of the initial substrate 12 when the initial bit line metal layer 13 is in direct contact with the initial substrate 12. By isolating the initial bit line metal layer 13 from the initial substrate 12 by the first protective layer 180, direct contact between the initial bit line metal layer 13 and the initial substrate 12 can be avoided, thereby reducing the probability that the initial bit line metal layer 13 contaminates the initial substrate 12 and further improving the stability of the semiconductor structure.

In some embodiments, after the initial bit line 130 is formed, a bit line protective layer 190 is further formed on the top surface of the initial bit line 130 which is used to protect the initial bit line 130. In other embodiments, the bit line protective layer may not be formed, i.e., the top surface of the initial bit line is flush with the top surface of the initial substrate.

In some embodiments, the material of the bit line protective layer 190 may be same as the material of the first isolation layer 170, and both are silicon nitride.

Figure 4:
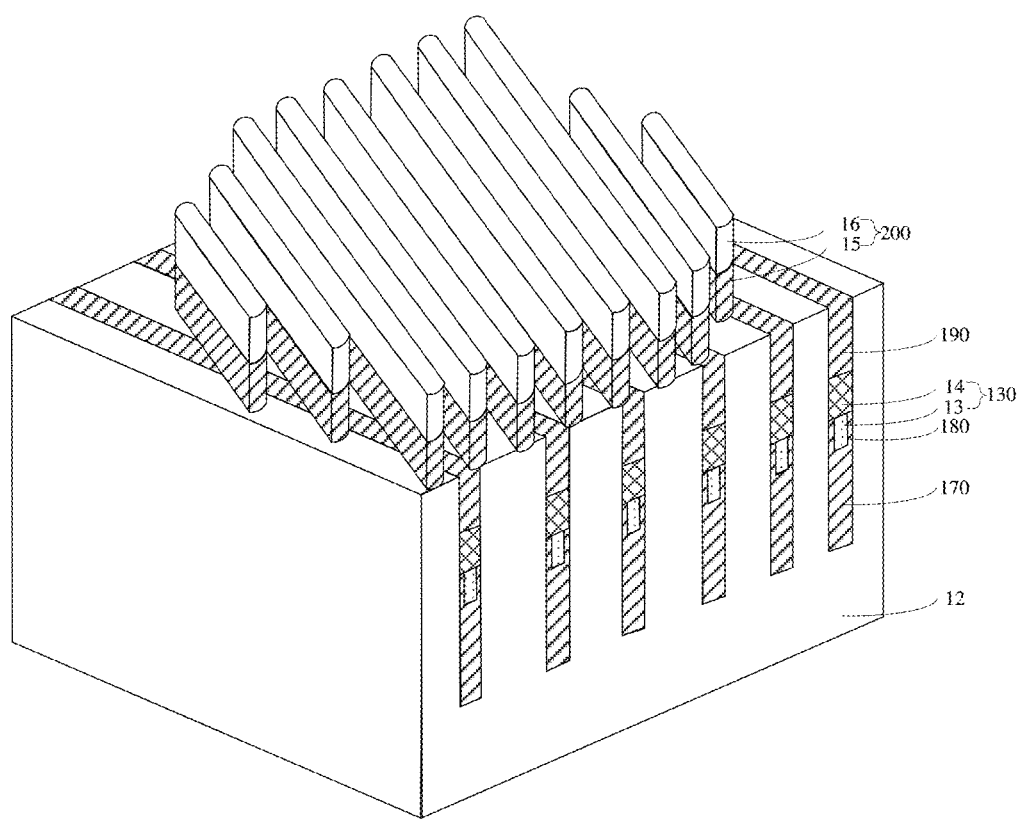

Referring to FIGS. 4-8, after the initial bit line 130 is formed, the initial substrate 12 located on both sides of the initial bit lines 130 is patterned to form the active areas 110, and the initial substrate 12 below the initial bit lines 130 serves as the substrate 100;

Specifically, referring to FIG. 4, a second initial mask layer 200 is formed on the surface of the initial substrate 12. In some embodiments, the second initial mask layer 200 may be a two-layer structure with an etching layer 15 and a pattern layer 16, in which the material of the etching layer 15 in contact with the surface of the initial substrate 12 may be selected according to the material of the bit line protective layer 190 for protecting the bit line protective layer 190 from being etched during etching, and the pattern layer 16 is used for providing an etching pattern.

Figure 5:
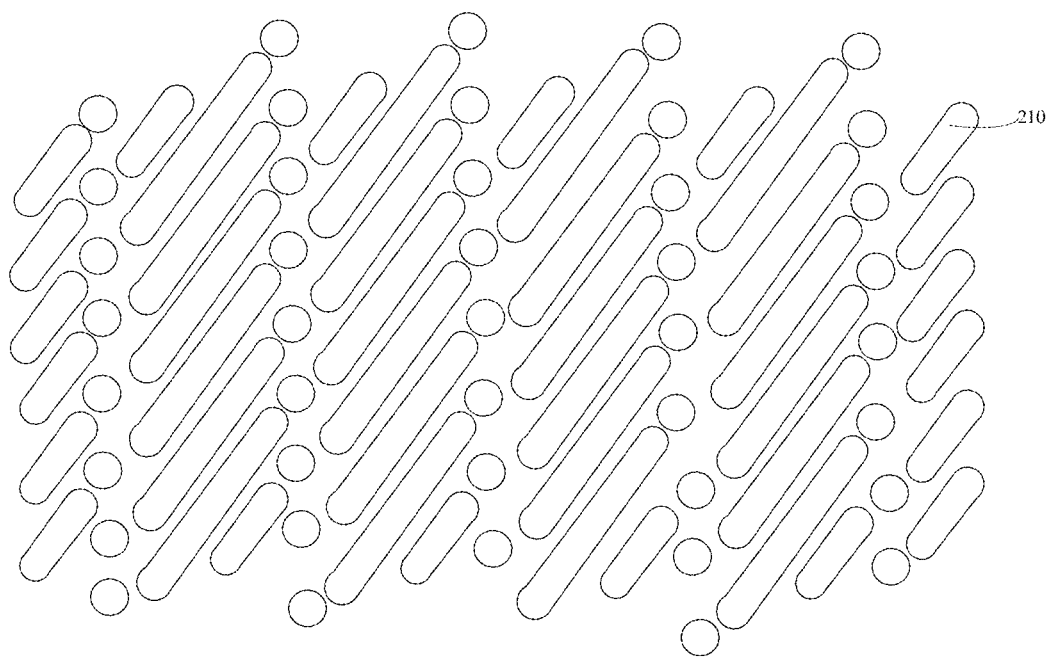
FIGS. 5-6 are top-views illustrating a semiconductor device according to some embodiments of the present disclosure.
Figure 6:
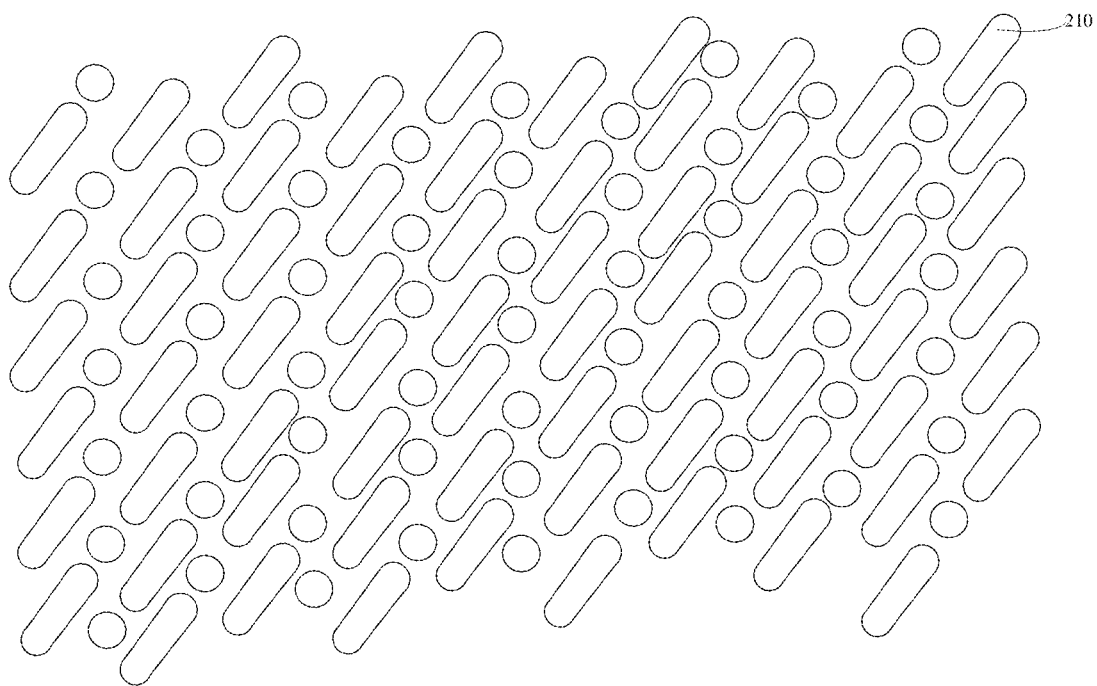

Referring to FIGS. 5 and 6, FIGS. 5 and 6 are schematic structural diagrams of a method for manufacturing a semiconductor structure along the top view direction in FIG. 4.

Specifically, the second initial mask layer 200 (refer to FIG. 4) is patterned to form a second mask layer 210. It should be noted that the circles in FIGS. 5 and 6 indicate that the second initial mask layer 200 (refer to FIG. 4) breaks from the circles, finally forming a small island type second mask layer 210. The second mask layer 210 serves as a mask for forming active areas.

Figure 7:
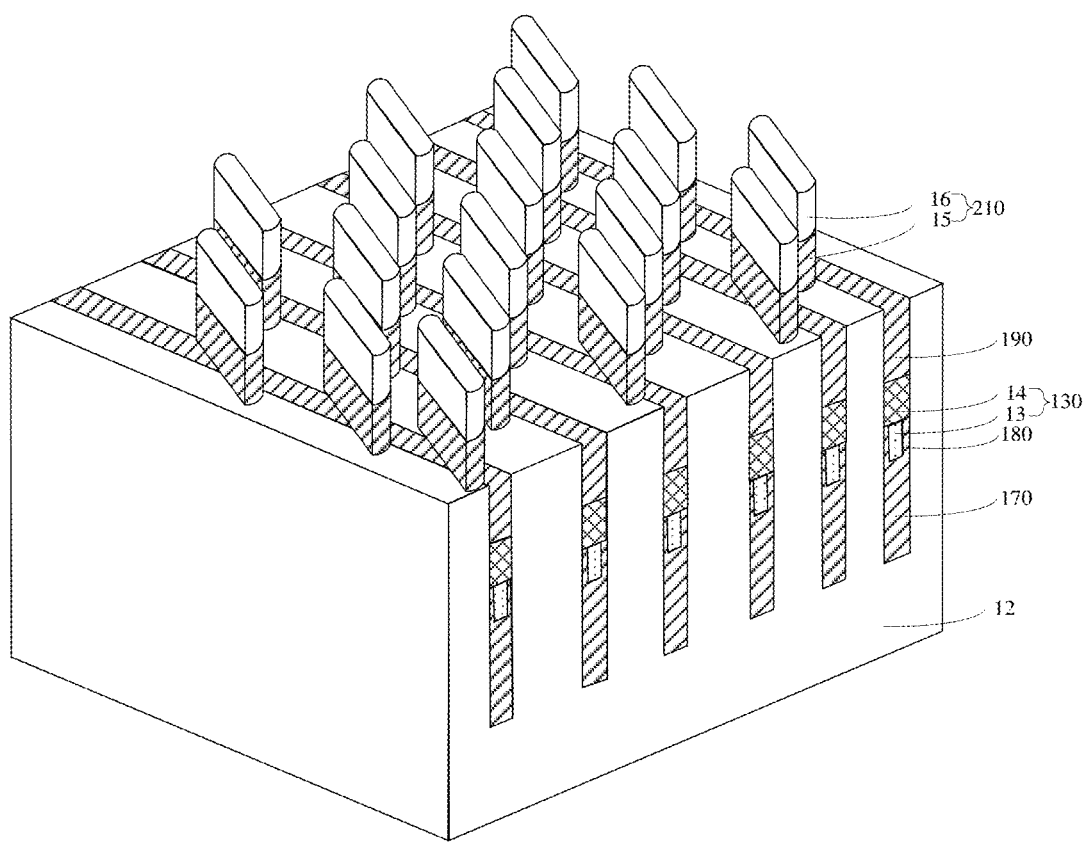
Figure 8:
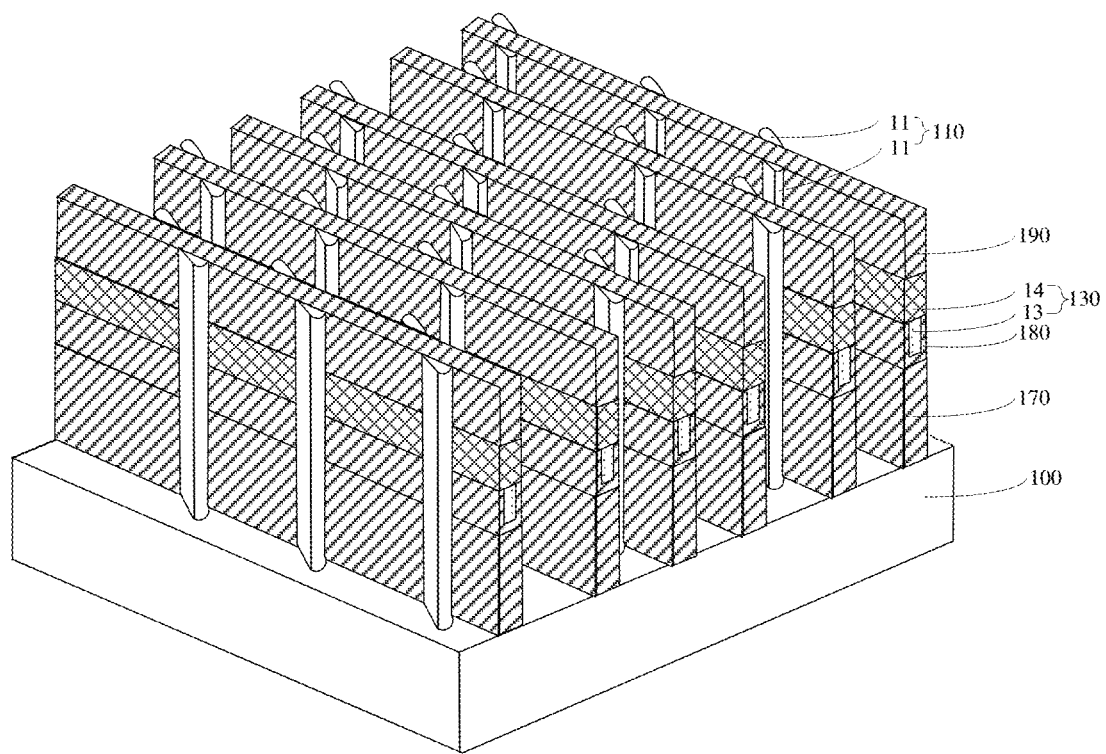

Referring to FIGS. 7 and 8, the active areas 110 are formed by etching with the second mask layer 210 as a mask. It can be understood that the active areas 110 are formed by etching the initial substrate 12, and thus the material of the initial substrate 12 may be a semiconductor material such as silicon, germanium or the like, so as to realize the function of the semiconductor structure. The material of the active areas 110 is the same as that of the initial substrate 12.

It should be understood that, since the material of the etching layer 15 is the same as that of the bit line protective layer 190, the bit line protective layer 190 and the part of the initial bit line 130 below the bit line protective layer 190 are not etched during etching, and thus the sub-active areas 11 intersecting with the initial bit line 130 are formed.

In other embodiments, the material of the initial substrate may also be an insulating material, and the method for forming the active areas may be to pattern the initial substrate to form active area grooves, and then fill the active area grooves with corresponding materials as required to form the active areas.

Figure 9:
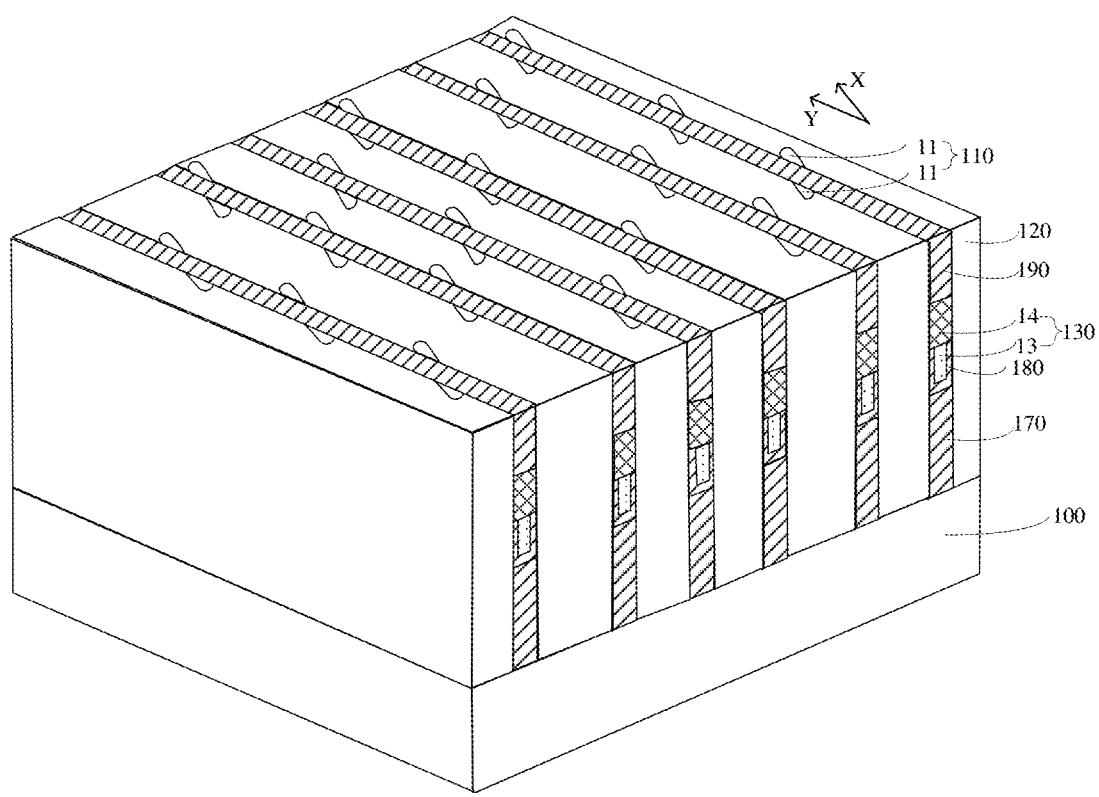

Referring to FIG. 9, an isolation structure 120 is formed on the substrate 100, in which the isolation structure 120 fills an area defined by active areas 110 and initial bit lines 130, is used to isolate adjacent ones of the active areas 110, and can protect the initial bit line 130.

In some embodiments, the material of the isolation structure 120 may be an insulating material such as silicon nitride and the corresponding material may be selected according to requirements.

In other embodiments, the material of the initial substrate is an insulating material, in this case, the method for forming the active areas may be that the active area grooves are formed first and then the active areas are formed. Since the material of the initial substrate is an insulating material, there is no need to additionally form an isolation structure. The initial substrate directly below the bit line structure serves as the substrate, and the remaining initial substrate serves as the isolation structure.

Figure 10:
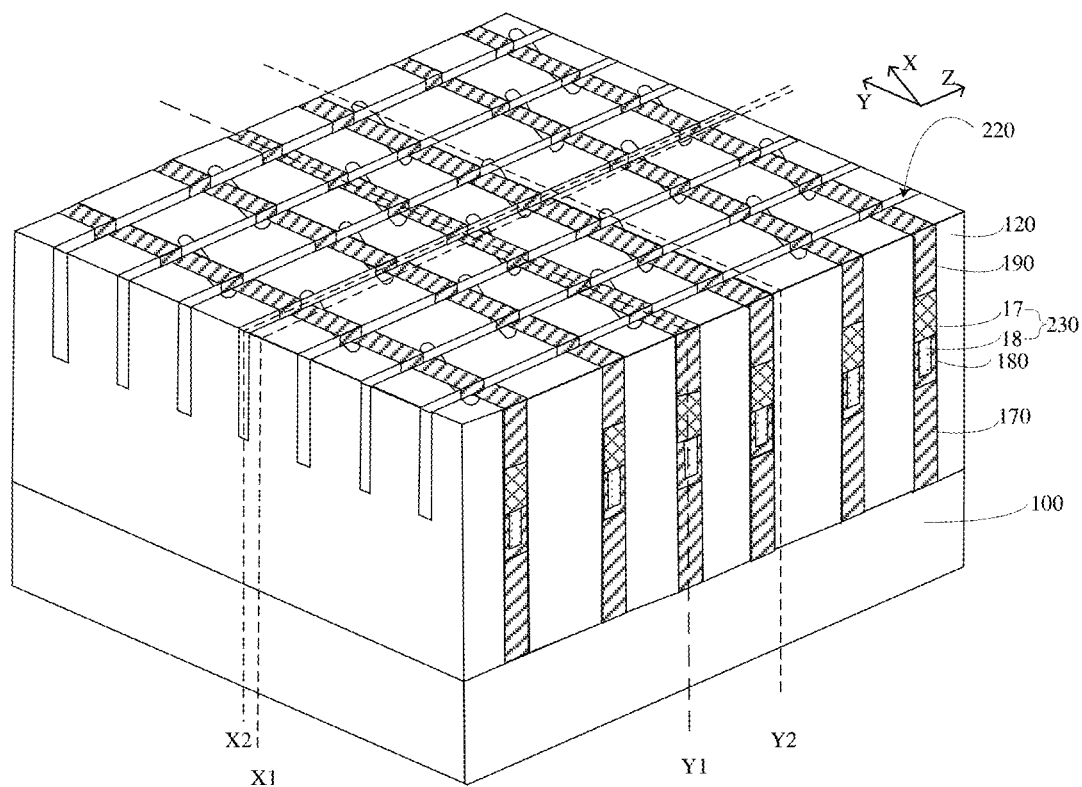

Referring to FIG. 10, the active areas 110, the isolation structure 120, and the initial bit line 130 (refer to FIG. 9) are patterned to form word line trench 220 extending in a third direction Z parallel to the surface of the substrate 100, the word line trench 220 is located within the sub-active areas 11, the isolation structure 120 and the initial bit line 130, and the remaining initial bit line 130 serves as bit line 230. The word line trench 220 provides a process basis for the subsequent formation of the word line.

In some embodiments, the method for forming the word line trench 220 may be mask etching. In a process of forming the word line trench 220, the word line trench 220 penetrates the initial bit line contact layer 14 at least in a direction perpendicular to the surface of the substrate 100. The remaining initial bit line contact layer 14 serves as a bit line contact layer 17, and the remaining initial bit line metal layer 13 serves as a bit line metal layer 18, and the bit line contact layer 17 and the bit line metal layer 18 serve as a bit line 230.

In some embodiments, the depth of the word line trench 220 located within the initial bit line metal layer 13 is less than or equal to ⅔ of the total thickness of the initial bit line metal layer 13 (refer to FIG. 9). It is understood that the deeper the depth of the word line trench 220, the thinner the thickness of the initial bit line metal layer 13 in a direction perpendicular to the surface of the substrate 100, which may affect the normal operation of the semiconductor structure.

Referring to FIGS. 11-14, FIGS. 11-14 are schematic structural diagrams of a manufacturing method showing by the cross-sections in the direction of Y1, Y2, X1 and X2 in FIG. 10, respectively.

Figure 11:
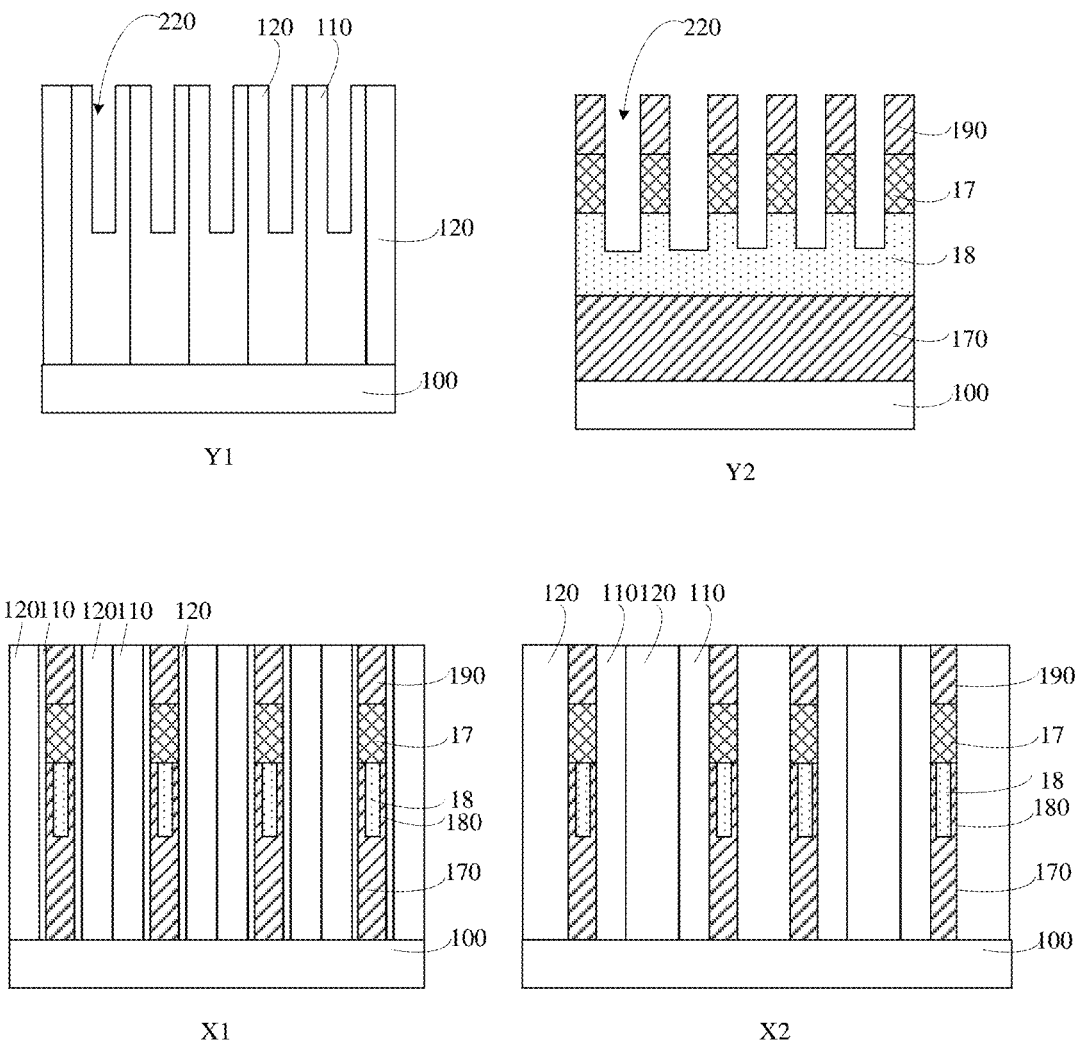
Figure 12:
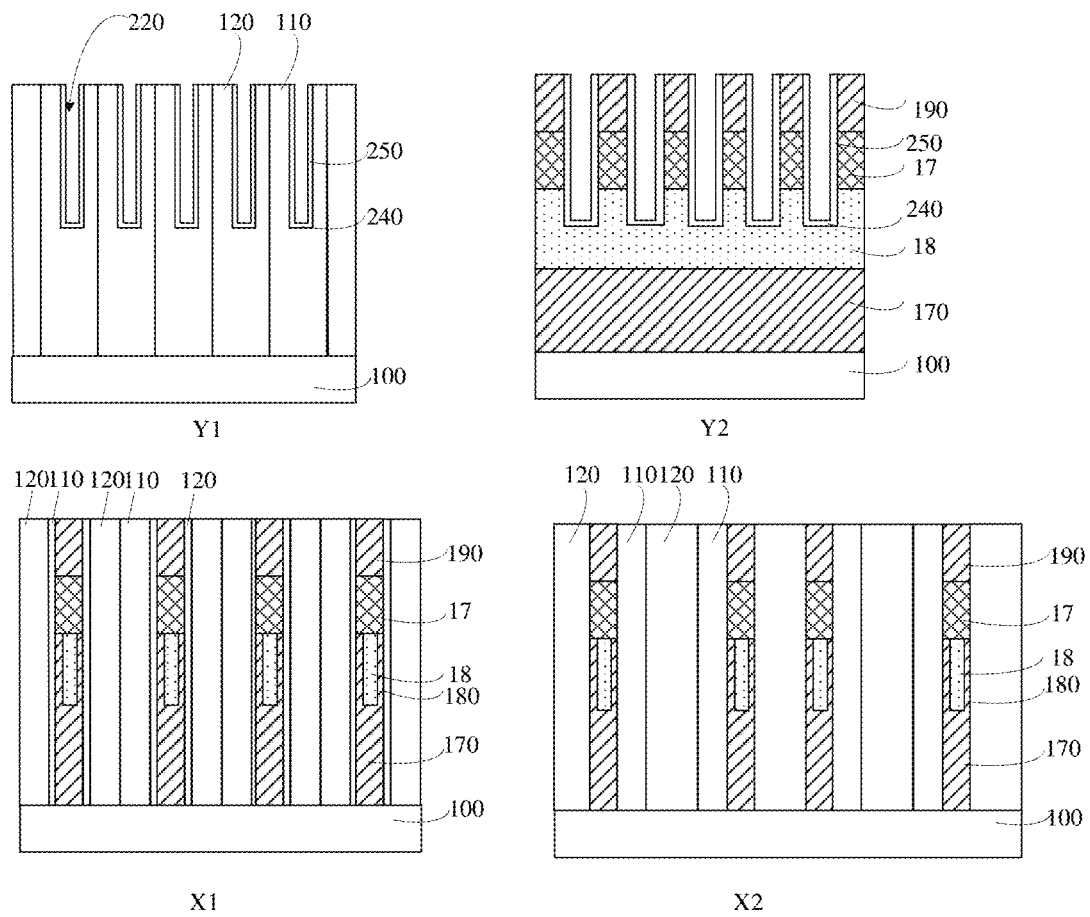

Specifically, referring to FIGS. 11 and 12, a gate dielectric layer 240 is formed, the gate dielectric layer 240 is located on the surfaces of the sub-active areas 11 exposed by the word line trench 220. In some embodiments, the method of forming the gate dielectric layer 240 may be to oxidize the sub-active areas 11 exposed by the word line trench 220 to form the gate dielectric layer 240; in other embodiments, the method of forming the gate dielectric layer may also be to deposit a layer of oxide on the surfaces of the sub-active areas exposed by the word line trench to form the gate dielectric layer. The gate dielectric layer 240 is used to improve the reliability of the semiconductor structure.

During the oxidation process, the surface of the bit line 230 (refer to FIG. 10) exposed by the word line trench 220 is also oxidized to form an oxide layer 250; the oxide layer 250 provides a process basis for subsequent formation of the second air gap. In other embodiments, the method of forming the oxide layer may also be to deposit one layer of oxide layer on the sidewall of the word line trench to form an oxide layer.

Figure 13:
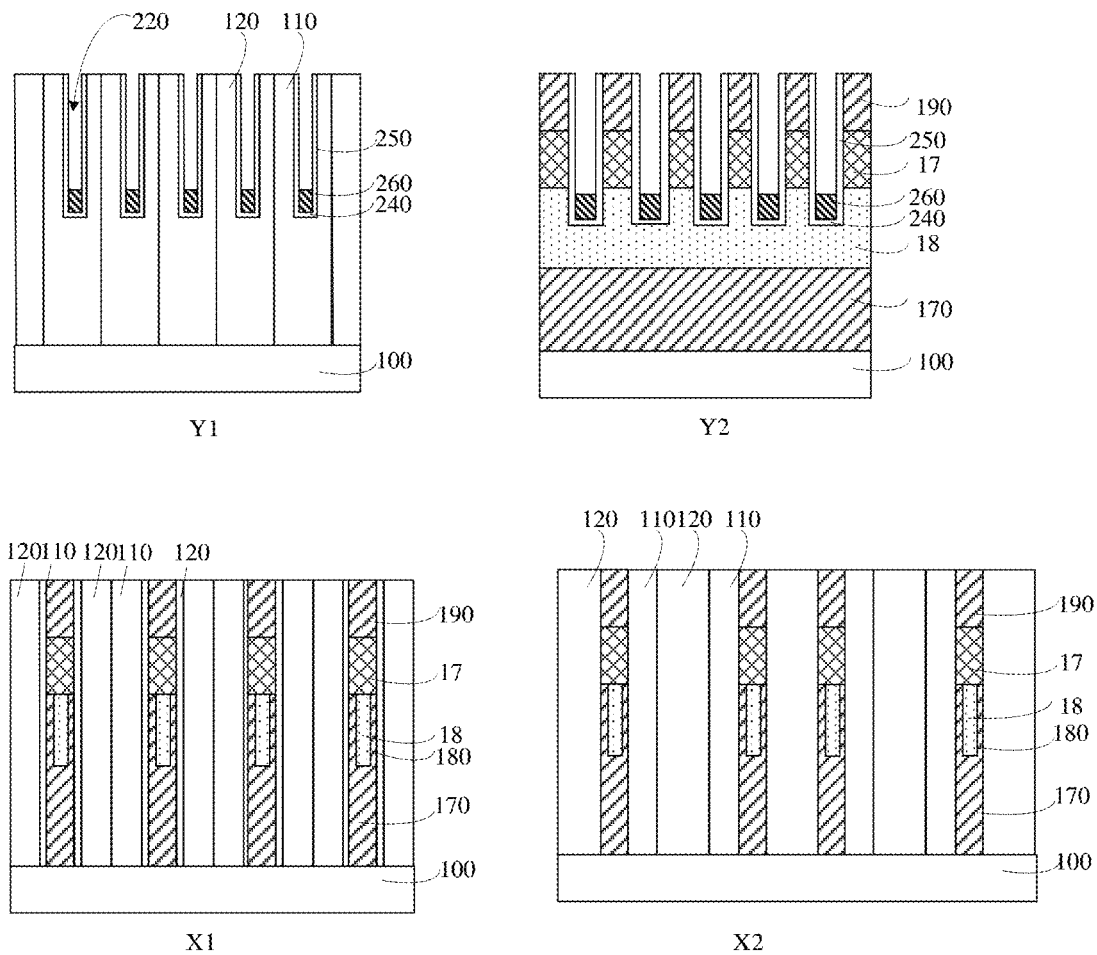
Figure 14:
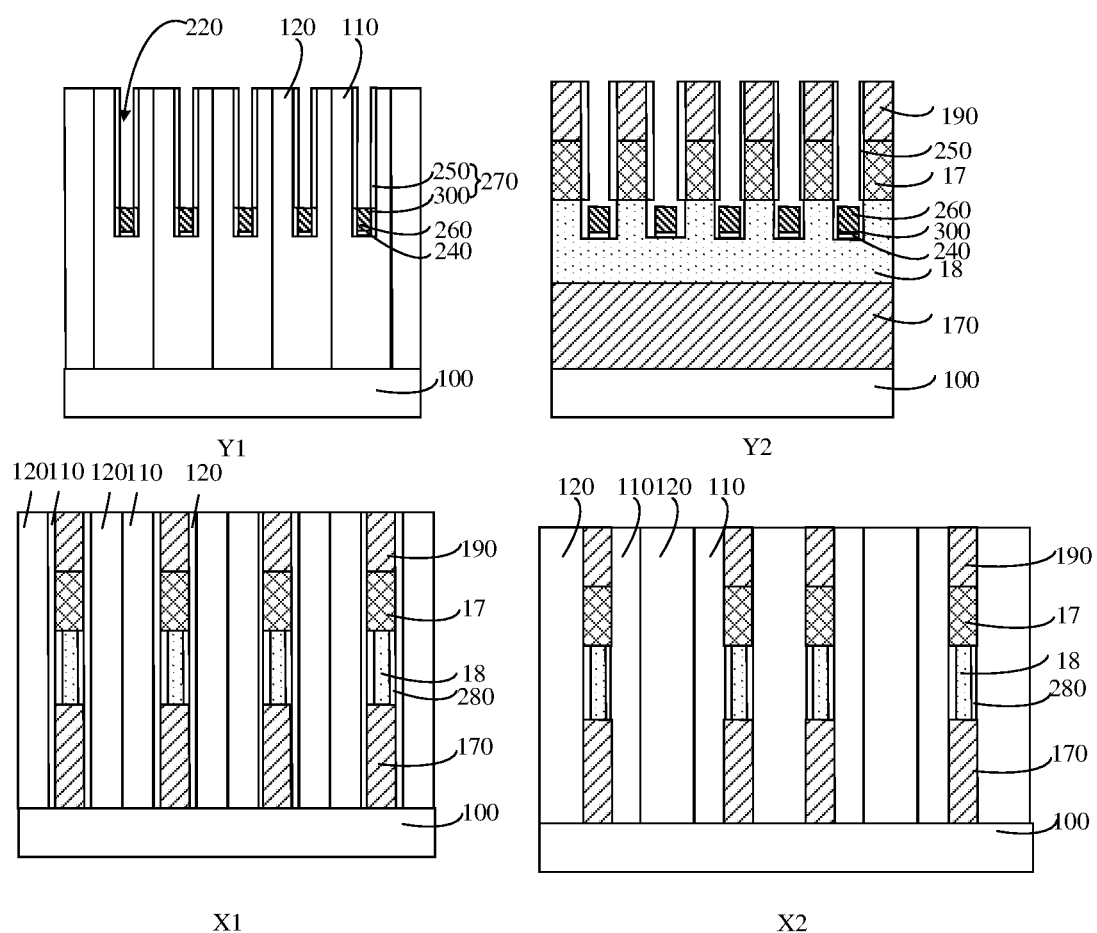

Referring to FIGS. 13 and 14, the word line 260 and the insulating structure 270 are formed, in which the word line 260 is located on the gate dielectric layer 240 and fills the word line trench 220, and the insulating structure 270 is located between the word line 260 and the bit line 230. The insulating structure 270 is used for isolating the word line 260 from the bit line 230 and preventing contact between the word line 260 and the bit line 230.

Specifically, referring to FIG. 13, in some embodiments, in a direction perpendicular to the surface of the substrate 100, the word line 260 has a thickness less than or equal to ⅔ of the thickness of the bit line metal layer 18, for example, the thickness of the word line 260 is ½ of the thickness of the bit line metal layer 18. It is understood that the smaller the thickness of the word line 260, the less the parasitic capacitance between the word line 260 and the bit line metal layer 18, which is beneficial to improve the performance of the semiconductor structure. In other embodiments, the word line may also be in contact with an oxide layer of the sidewall of the bit line contact layer.

Referring to FIG. 14, after the word lines 260 are formed, the method further includes: removing the first protective layer 180 (refer to FIG. 13) to form a first air gap 280. Air has a dielectric constant of about 1. The first air gap 280 is formed to improve the insulation performance between the word line 260 and the bit line metal layer 18, at the same time, the parasitic capacitance is reduced, thereby improving the stability of the semiconductor structure.

After the word line 260 is formed, the method further includes: removing the oxide layer 250 located on the sidewall of the bit line 230 to form a second air gap 300, in which the second air gap 300 serves as a part of the insulating structure 270. The formation of the second air gap 300 can improve the insulating performance between the word line 260 and the active area 110, at the same time; the parasitic capacitance is reduced, thereby improving the stability of the semiconductor structure.

Figure 15:
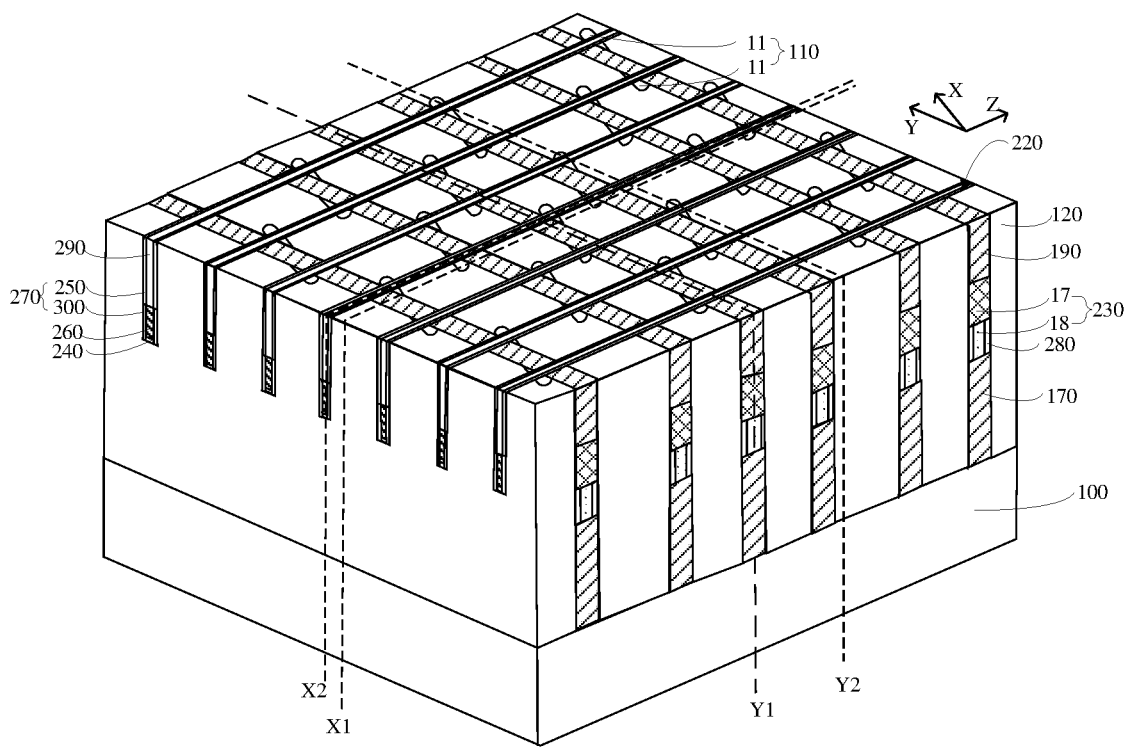

Referring to FIG. 15, in some embodiments, after the second air gaps 300 are formed, the method further includes: forming word line protective layers 290. The word line protective layer 290 is located on the top surface of the word line 260 and fills up the word line trench 220, and the word line protection layer 290 is used for protecting the word line 260. In other embodiments, the word line protective layer may not be formed, i.e., the word line fills up the word line trench.

The embodiments of the present disclosure provide a method for manufacturing a semiconductor structure, after patterning the active areas 110, the isolation structure 120 and initial bit line 130 on the substrate 100 to form the word line trench 220 and the bit line 230, a gate dielectric layer 240 is formed on the bottom surface of the word line trench 220, and a word line 260 and an insulating structure 270 are formed on the surface of the gate dielectric layer 240. By the means of forming the bit line 230 firstly and then forming the word line 260, the process of manufacturing the semiconductor structure is reduced, thereby reducing the process time for producing the semiconductor structure.

Correspondingly, the embodiments of the present disclosure also provide a semiconductor structure. The semiconductor structure provided in the embodiments of the present disclosure will be described in detail with reference to the accompanying drawings. It should be noted that the same or corresponding parts as the preceding method for manufacturing a semiconductor structure can refer to the preceding corresponding description, and will not be repeated below.

Referring to FIG. 15, the semiconductor structure includes: a substrate 100 and a plurality of spaced active areas 110 on the substrate 100 and an isolation structure 120 between adjacent ones of the active areas 110, in which the active areas 110 extend along a first direction X parallel to a surface of the substrate 100, each active area 110 includes a plurality of sub-active areas 11 arranged along the first direction X, the substrate 100 further has a bit line 230 extending along a second direction Y parallel to the surface of the substrate 100 is provided on the substrate, and the sub-active areas 11 intersect the bit line 230; a word line trench 220 extending in a third direction Z parallel to the surface of the substrate 100, in which the word line trench 220 is located within the sub-active areas 11, the isolation structure 120, and the bit line 230; a gate dielectric layer 240 located on surfaces of the sub-active areas 11 exposed by the word line trench 220; a word line 260 and an insulating structure 270, in which the word line 260 is located on the gate dielectric layer 240 and fills the word line trench 220, and the insulating structure 270 is located between the word line 260 and the bit line 230. The volume of the semiconductor structure is reduced by forming a semiconductor structure in which both the word line 260 and the bit line 230 are located within the isolation structure 120.

In some embodiments, the material of the substrate 100 may be the same as the material of the active areas 110, both may be the semiconductor material such as silicon or germanium. In other embodiments, the material of the substrate 100 may be the same as the material of the isolation structure 120, both may be an insulating material such as silicon oxide or silicon nitride. In other embodiments, the material of the substrate 100 may be different from the material of the active areas 110 and the isolation structure 120, and it should be understood that the material of the substrate 100 may be selected according to the manufacturing process.

In some embodiments, the bit line 230 includes a bit line metal layer 18 and a bit line contact layer 17 located on the surface of the bit line metal layer 18 that are stacked in sequence; in a direction perpendicular to the surface of the substrate 100, the bottom surface of the word line 260 is lower than or flush with the bottom surface of the bit line contact layer 17. The volume of the semiconductor structure can be reduced by arranging the word line 260 located in the isolation structure 120.

When the bottom surface of the word line 260 is lower than the bottom surface of the bit line contact layer 17, in a direction perpendicular to the surface of the substrate 100, the depth of the word line 260 located in the bit line metal layer 18 is less than or equal to $2/3$ of the total thickness of the bit line metal layer 18. Understandably, the depth of the word line 260 located in the bit line metal layer 18 is related to the depth of the word line trench 220, the deeper the word line trench 220, correspondingly, the deeper the depth of the word lines 260 that may be located in the bit line metal layer 18. In a plane perpendicular to the surface of the substrate 100, the performance of the word lines 260 is affected by reducing the thickness of the bit line metal layer 18 in the word line trench 220, and the thickness of the word line 260 in the bit line metal layer 18 is thinner, the parasitic capacitance between the word line 260 and the bit line 230 is less, so that the performance of the semiconductor structure can be improved.

In some embodiments, the semiconductor structure further includes a first isolation layer 170 located between the bit line 230 and the substrate 100; a first air gap 280, in which the first air gap 280 is located between the sidewall of the bit line metal layer 18 and the sidewall of the sub-active area 11. It should be understood that when the substrate 100 is semiconductor material, the first isolation layer 170 is used to isolate the bit line metal layer 18 from the substrate 100, so as to prevent ion diffusion of the bit line metal layer 18 and thus contaminating the substrate 100. When the substrate is insulating material, the first isolation layer may not be contained; the first air gap 280 is used to isolate the bit line metal layer 18 from the active areas 110, thereby preventing ion diffusion of the bit line metal layer 18 from contaminating the active areas 110. The first air gap 280 can also isolate the bit line metal layer 18 from the word line 260, thereby improving insulation between the bit line metal layer 18 and the word line 260, and the formation of the first air gaps 280 can reduce parasitic capacitance between the bit line metal layer 18 and the active areas 110.

In some embodiments, the insulating structure 270 includes a second air gap 300. The second air gap 300 is located between the sidewall of the bit line metal layer 18 and the sidewall of the word line 260. The insulating structure 270 is used to isolate the word line 260 and the bit line 230. The insulating structure 270 also includes an oxide layer 250. Compared to the oxide layer 250, the second air gaps 300 have better insulating performance. In other embodiments, the insulating structure may include only the oxide layer or only the second air gap.

In some embodiments, the semiconductor structure further includes a word line protective layer 290 located on the top surface of the word line 260 and the word line protective layer 290 is used for protecting the word line 260. In other embodiments, the semiconductor structure may also include only the word line, i.e. the top surface of the word line is flush with the isolation structure.

The embodiments of the present disclosure provided a semiconductor structure in which both the word line 260 and the bit line 230 are located within the isolation structure 120, and the volume of the semiconductor structure is reduced by the bit line 230 locating within the isolation structure 120, and the first air gap 280 is provided to isolate the bit line metal layer 18 from the active areas 110, thereby improving the insulation between the bit line metal layer 18 and the word line 260, and the second air gap 300 is provided to improve the insulation between the word line 260 and the bit line 230 and simultaneously reduce the parasitic capacitance between the word line 260 and the bit line 230.

Those of ordinary skill in the art will appreciate that the above-described embodiments are specific embodiments for implementing the present disclosure and that in practical application various changes may be made in form and detail thereof without departing from the spirit and scope of the present disclosure. Any person skilled in the art may make their own changes and modifications without departing from the spirit and scope of this application, and thus the scope of protection of this disclosure shall be subject to the scope defined by the claims.

The invention claimed is:

1. A method for manufacturing a semiconductor structure, comprising:

providing a substrate, a plurality of spaced active areas on the substrate and an isolation structure located between adjacent ones of the active areas, wherein the active areas extend along a first direction parallel to a surface of the substrate, each of the active areas comprises a plurality of sub-active areas arranged along the first direction, an initial bit line extending along a second direction parallel to the surface of the substrate is provided on the substrate, and the sub-active areas intersect the initial bit line;

forming a word line trench extending along a third direction parallel to the surface of the substrate by patterning the active areas, the isolation structure and the initial bit line, wherein the word line trench is located within the sub-active areas, the isolation structure, and the initial bit line, and the remaining initial bit line serves as a bit line;

forming a gate dielectric layer located on surfaces of the sub-active areas exposed by the word line trench;

forming a word line and an insulating structure, wherein the word line is located on the gate dielectric layer and fills the word line trench, and the insulating structure is located between the word line and the bit line.

2. The method for manufacturing a semiconductor structure according to claim 1, wherein the initial bit line comprises: an initial bit line metal layer and an initial bit line contact layer stacked in sequence; when forming the word line trench, the word line trench penetrates the initial bit line contact layer at least in a direction perpendicular to the surface of the substrate, the remaining initial bit line contact layer serves as a bit line contact layer, the remaining initial bit line metal layer serves as a bit line metal layer, and the bit line contact layer and the bit line metal layer serve as the bit line.

3. The method for manufacturing a semiconductor structure according to claim 2, wherein a depth of the word line trench in the initial bit line metal layer is less than or equal to ⅔ of a total thickness of the initial bit line metal layer.

4. The method for manufacturing a semiconductor structure according to claim 1, wherein forming the active areas, the isolation structure and the initial bit line comprises:
providing an initial substrate;
patterning the initial substrate to form a bit line trench extending along the second direction;
forming the initial bit line which fills the bit line trench;
patterning the initial substrate located on two sides of the initial bit line to form the active areas after forming the initial bit line, wherein the initial substrate located below the initial bit line serves as the substrate;
forming the isolation structure on the substrate, wherein the isolation structure fills an area between the active areas and the initial bit lines.

5. The method for manufacturing a semiconductor structure according to claim 4, further comprising:
forming a first protective layer on a sidewall of each of the sub-active areas in the bit line trench after forming the bit line trench, wherein the formed initial bit line metal layer is located on the surface of the first protective layer;
removing the first protective layer to form a first air gap after forming the word line.

6. The method for manufacturing a semiconductor structure according to claim 5, further comprising: forming a first isolation layer in the bit line trench before forming the initial bit line, wherein the first isolation layer is located between the initial bit line and the substrate.

7. The method for manufacturing a semiconductor structure according to claim 6, wherein forming the first isolation layer and the initial bit line comprises:
forming an initial isolation layer in the bit line trench, wherein a top surface of the initial isolation layer is lower than a top surface of each of the active areas;
removing a part of the initial isolation layer to form a groove, wherein the initial isolation layer below the groove serves as the first isolation layer, and the initial isolation layer between an inner wall of the groove and the sub-active areas serves as the first protective layer;
forming the initial bit line which fills up the groove, a top surface of the initial bit line is higher than a top surface of the first protective layer, and a portion of the initial bit line is in contact with the sub-active areas.

8. The method for manufacturing a semiconductor structure according to claim 1, wherein an oxidation treatment is performed on the sub-active areas exposed by the word line trench to form the gate dielectric layer.

9. The method for manufacturing a semiconductor structure according to claim 8, wherein during the oxidation treatment, the oxidation treatment is also performed on a surface of the bit line exposed by the word line trench to form an oxide layer.

10. The method for manufacturing a semiconductor structure according to claim 9, further comprising: removing the oxide layer located on a sidewall of the bit line to form a second air gap after forming the word line, wherein the second air gap serves as a part of the insulating structure.

11. The method for manufacturing a semiconductor structure according to claim 10, further comprising: forming a word line protective layer after forming the second air gap, wherein the word line protective layer is located on a top surface of the word line and fills the word line groove.

12. A semiconductor structure, comprising:
a substrate and a plurality of spaced active areas located on the substrate and an isolation structure between adjacent ones of the active areas, wherein the active areas extend along a first direction parallel to a surface of the substrate, each of the active areas comprises a plurality of sub-active areas arranged along the first direction, a bit line extending along a second direction parallel to the surface of the substrate is provided on the substrate, and the sub-active areas intersect the bit line;
a word line trench extending along a third direction parallel to the surface of the substrate, wherein the word line trench is located within the sub-active areas, the isolation structure, and the bit line;
a gate dielectric layer located on surfaces of the sub-active areas exposed by the word line trench;
a word line and an insulating structure, wherein the word line is located on the gate dielectric layer and fills the word line trench, and the insulating structure is located between the word line and the bit line.

13. The semiconductor structure according to claim 12, wherein the bit line comprises: a bit line metal layer and a bit line contact layer located on a surface of the bit line metal layer, wherein the bit line metal layer and the bit line contact layer are stacked in sequence; in a direction perpendicular to the surface of the substrate, a bottom surface of the word line is lower than or flush with a bottom surface of the bit line contact layer.

14. The semiconductor structure according to claim 13, wherein in a direction perpendicular to the surface of the substrate, a depth of the word line located in the bit line metal layer is less than or equal to ⅔ of a total thickness of the bit line metal layer.

15. The semiconductor structure according to claim 13, wherein the semiconductor structure further comprises: a first isolation layer located between the bit line and the substrate; a first air gap located between the bit line metal layer and each of the sub-active areas.

16. The semiconductor structure according to claim 13, wherein the insulating structure includes a second air gap located between a sidewall of the bit line metal layer and a sidewall of the word line.

17. The semiconductor structure according to claim 12, wherein the semiconductor structure further comprises: a word line protective layer located on a top surface of the word line.

* * * * *